(12) United States Patent
Oikawa et al.

(10) Patent No.: US 7,847,197 B2
(45) Date of Patent: Dec. 7, 2010

(54) MULTILAYER CIRCUIT BOARD AND MANUFACTURING METHOD THEREOF

(75) Inventors: Yoshikazu Oikawa, Yasu (JP); Takayoshi Yoshikawa, Yasu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 82 days.

(21) Appl. No.: 11/968,700

(22) Filed: Jan. 3, 2008

(65) Prior Publication Data

US 2008/0093117 A1    Apr. 24, 2008

Related U.S. Application Data

(63) Continuation of application No. PCT/JP2006/308084, filed on Apr. 17, 2006.

(30) Foreign Application Priority Data

Jul. 12, 2005    (JP) .............................. 2005-203443

(51) Int. Cl.
H01R 12/04    (2006.01)
H05K 1/11    (2006.01)
H01K 3/10    (2006.01)

(52) U.S. Cl. ........................................ 174/262; 29/852

(58) Field of Classification Search ......... 174/262–256; 361/792–795; 29/852
See application file for complete search history.

(56) References Cited

U.S. PATENT DOCUMENTS 5,459,287 A * 10/1995 Swamy ........................ 174/266

| 6,048,424 A | 4/2000 | Asai et al. |
| 2001/0026435 A1 | 10/2001 | Sakai |
| 2007/0107933 A1 | 5/2007 | Yamamoto et al. |
| 2007/0124926 A1 * | 6/2007 | Ishimaru et al. ............... 29/830 |

FOREIGN PATENT DOCUMENTS

| JP | 2680443 B2 | 11/1997 |
| JP | 10-284836 A | 10/1998 |
| JP | 11-074645 A | 3/1999 |
| JP | 11-340627 A | 12/1999 |
| JP | 2000-312057 A | 11/2000 |
| JP | 2001-007520 A | 1/2001 |
| JP | 2001-313466 A | 11/2001 |
| JP | 2005-057157 A | 3/2005 |
| JP | 2005-093945 A | 4/2005 |

OTHER PUBLICATIONS

Official communication issued in the International Application No. PCT/JP2006/308084, mailed on Jul. 18, 2006.
Official communication issued in counterpart Chinese Application No. 2006800242127, mailed on May 8, 2009.
Official Communication issued in corresponding Japanese Patent Application No. 2007-524522, mailed on Aug. 10, 2010.

* cited by examiner

*Primary Examiner*—Jeremy C Norris
(74) *Attorney, Agent, or Firm*—Keating & Bennett, LLP

(57) ABSTRACT

A multilayer circuit board includes a laminate having a plurality of ceramic layers, and a wiring pattern disposed in the laminate, wherein a ceramic layer includes, as the wiring pattern, a fully penetrating via-hole conductor that vertically passes through the ceramic layers, and a serial partially penetrating via-hole conductor that is electrically connected to the fully penetrating via-hole conductor in the ceramic layers and does not pass completely through the ceramic layers.

15 Claims, 8 Drawing Sheets

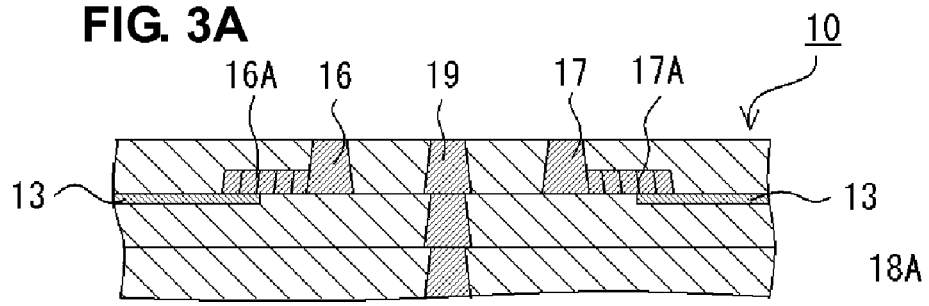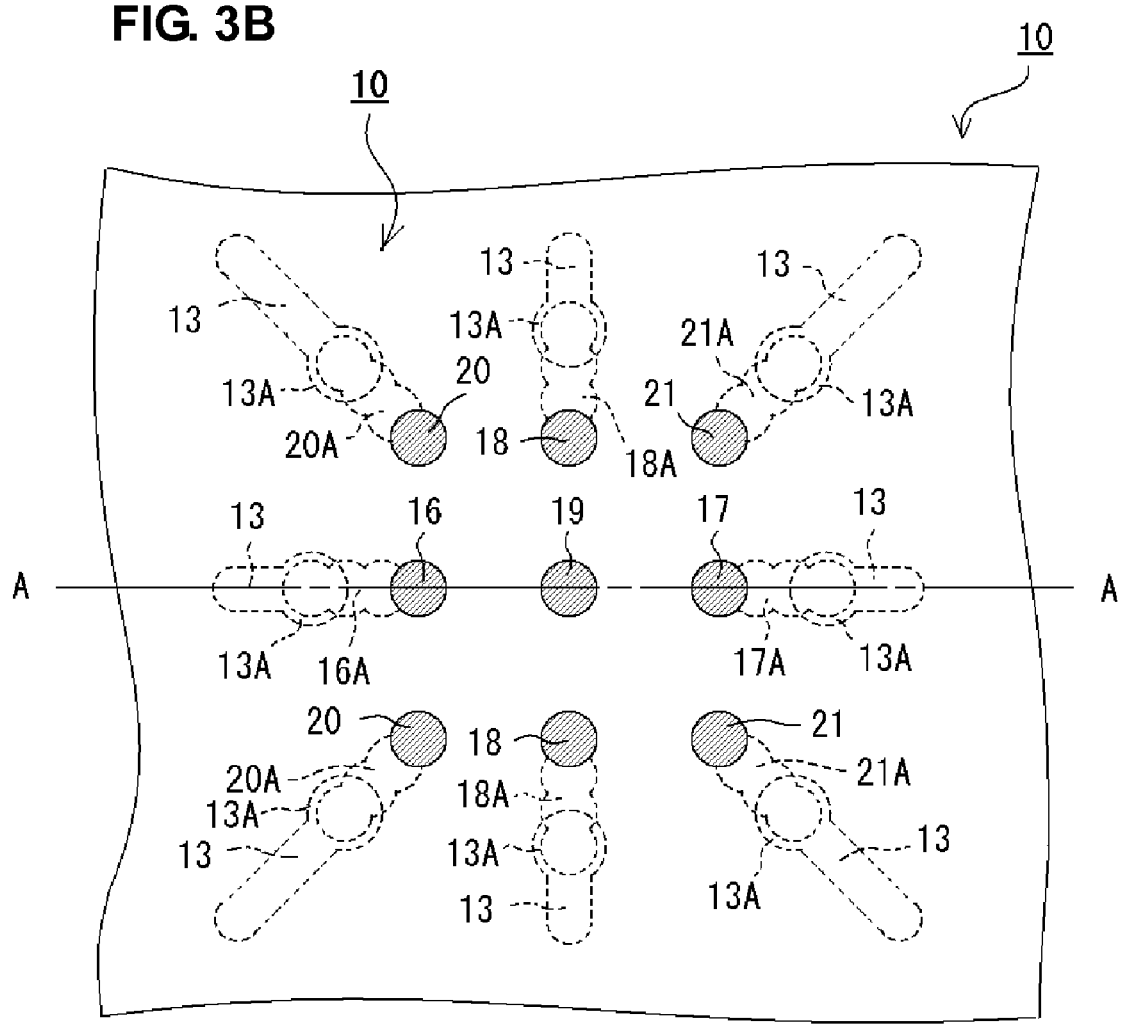

MULTILAYER CIRCUIT BOARD AND MANUFACTURING METHOD THEREOF

BACKGROUND OF THE INVENTION

1. Field of the Invention

The present invention relates to a multilayer circuit board and a manufacturing method thereof. More particularly, the present invention relates to a multilayer circuit board that is adaptable to high-density wiring and that can achieve more reliable connections, and a manufacturing method thereof.

2. Description of the Related Art

Recent dramatic progress in micromachining technology for integrated circuits has led to an increase in number of connection terminals and finer pitches of the connection terminals. Integrated circuits have recently been mounted on ceramic substrates mainly by flip chip bonding. Thus, flip chip bonding pads disposed on a ceramic substrate must also be designed for the finer pitches of connection terminals. To this end, several methods have been proposed.

For example, Japanese Patent No. 2680443 proposes a ceramic circuit board that includes no connection pad. Connection pads are generally formed by printing. However, a larger number of connection pads are difficult to print. Furthermore, even when a larger number of connection pads can be formed, the bonding strength between via-hole conductors and the connection pads is too small to ensure the bonding. Thus, in a technique described in Japanese Patent No. 2680443, a ceramic multilayer substrate is manufactured using a conductive paste having a firing shrinkage smaller than those of ceramic green sheets, and conductor layers inside via-holes (via-hole conductors) protrude from the ceramic multilayer substrate as connection pads. This eliminates the printing of connection pads and increases the bonding strength between the connection pads and the via-hole conductors, thus achieving finer pitches of the connection pads. However, Japanese Patent No. 2680443 gives no consideration to a connection structure between via-hole conductors and line conductors within the ceramic multilayer substrate.

Japanese Unexamined Patent Application Publication No. 2001-284811 proposes a laminated ceramic electronic component having an improved connection structure between via-hole conductors and line conductors, wherein the line conductors include connection lands. Ceramic green sheets that include via-hole conductors and ceramic green sheets that include line conductors are properly laminated and are sintered to connect the via-hole conductors to the line conductors. An inevitable processing error during the formation of via-hole conductors and line conductors in the ceramic green sheets, and an inevitable misalignment between via-hole conductors and line conductors may lead to poor connection between the via-hole conductors and the line conductors. According to Japanese Unexamined Patent Application Publication No. 2001-284811, the poor connection resulting from the processing error and the misalignment is prevented by providing a line conductor with a connection land having a diameter larger than the outer diameter of a via-hole conductor.

Japanese Unexamined Patent Application Publication No. 11-074645 proposes a method for manufacturing a multilayer ceramic substrate that is adaptable to high-density wiring. As illustrated in FIGS. 7A and 7B, a connection land 3 is formed at the bottom of each via-hole conductor 2 in a multilayer ceramic substrate 1. When via-hole conductors 2 are adjacent to each other, connection lands 3 of the via-hole conductors 2 are disposed in their respective ceramic layers. The via-hole conductors 2 are connected to the line conductors 4 through the connection lands 3. This technique is the same as that in Japanese Unexamined Patent Application Publication No. 2001-284811 in that the connection lands 3 are provided.

According to Japanese Unexamined Patent Application Publication No. 2001-284811 and Japanese Unexamined Patent Application Publication No. 11-074645, the connection lands connected to the line conductors or the via-hole conductors can prevent the poor connection resulting from the misalignment between the via-hole conductors and the line conductors or from the processing error of the via-hole conductors and the line conductors in the manufacture of the ceramic substrate. However, as illustrated in FIG. 7A, because a connection land 3 horizontally protrudes from a via-hole conductor 2, the protrusion interferes with a finer pitch between adjacent via-hole conductors 2. More specifically, as illustrated in FIG. 8, a finer pitch between the adjacent via-hole conductors 2 may result in a short between the connection land 3 and the adjacent via-hole conductors 2. A finer pitch may also result in delamination between a ceramic layer and the connection land 3 during firing because of differences in the coefficient of thermal expansion. To prevent the short and the delamination, therefore, a clearance is required between the via-hole conductors 2. This clearance, as well as the protrusion of the connection land 3, interferes with the finer pitch between the via-hole conductors 2.

SUMMARY OF THE INVENTION

In order to overcome the problems described above, preferred embodiments of the present invention provide a multilayer circuit board, and a method of manufacturing thereof, that is adaptable to high-density wiring in order to address the trend toward a finer pitch between connection terminals of an integrated circuit and that can achieve more reliable interlayer connection between wiring patterns.

According to a preferred embodiment of the present invention, a multilayer circuit board includes a laminate having a plurality of substrate layers and a wiring pattern disposed in the laminate, wherein at least one layer of the plurality of substrate layers includes, as the wiring pattern, at least one fully penetrating via-hole conductor that vertically passes through the substrate layer, and at least one partially penetrating via-hole conductor that is electrically connected to the fully penetrating via-hole conductor in the substrate layer and does not pass completely through the substrate layer.

Preferably, in a multilayer circuit board according to a preferred embodiment of the present invention, the at least one partially penetrating via-hole conductor is at least one serial partially penetrating via-hole conductor including a plurality of partially penetrating via-hole conductors.

Preferably, in a multilayer circuit board according to a preferred embodiment of the present invention, the substrate layer that includes the at least one fully penetrating via-hole conductor and the at least one serial partially penetrating via-hole conductor is disposed at the top of the laminate.

Preferably, in a multilayer circuit board according to a preferred embodiment of the present invention, the substrate layer that includes the at least one fully penetrating via-hole conductor and the at least one serial partially penetrating via-hole conductor is arranged such that the serial partially penetrating via-hole conductor is disposed on the bottom, and an end surface of the fully penetrating via-hole conductor on a top surface of the substrate layer is arranged to be connected to a connection terminal of a surface mount device to be mounted on the substrate layer.

Preferably, in a multilayer circuit board according to a preferred embodiment of the present invention, the at least one fully penetrating via-hole conductor is connected to at least one in-plane conductor of the substrate layer through the at least one serial partially penetrating via-hole conductor.

Preferably, in a multilayer circuit board according to a preferred embodiment of the present invention, the at least one fully penetrating via-hole conductor includes a first fully penetrating via-hole conductor and a second fully penetrating via-hole conductor, the first fully penetrating via-hole conductor and the second fully penetrating via-hole conductor being adjacent to each other, wherein a first serial partially penetrating via-hole conductor connected to the first fully penetrating via-hole conductor extends away from the second fully penetrating via-hole conductor.

Preferably, in a multilayer circuit board according to a preferred embodiment of the present invention, a second serial partially penetrating via-hole conductor connected to the second fully penetrating via-hole conductor extends away from the first fully penetrating via-hole conductor.

Preferably, in a multilayer circuit board according to a preferred embodiment of the present invention, the at least one fully penetrating via-hole conductor further includes a third fully penetrating via-hole conductor, which is adjacent to the first fully penetrating via-hole conductor or the second fully penetrating via-hole conductor, wherein a third serial partially penetrating via-hole conductor connected to the third fully penetrating via-hole conductor extends away from the first fully penetrating via-hole conductor and the second fully penetrating via-hole conductor.

Preferably, in a multilayer circuit board according to a preferred embodiment of the present invention, the substrate layer is formed of a low-temperature co-fired ceramic material, and the wiring pattern is formed of an electroconductive material mainly composed of silver or copper.

According to another preferred embodiment of the present invention, a method for manufacturing a multilayer circuit board including a laminate of a plurality of substrate layers and a wiring pattern disposed in the laminate, includes a first step of forming a through hole that vertically passes through at least one layer of the plurality of substrate layers, and at least one semi-through hole that is in contact with the through hole and does not pass completely through the substrate layer; and a second step of filling the through hole and the at least one semi-through hole with an electroconductive material to form a fully penetrating via-hole conductor and a partially penetrating via-hole conductor as the wiring pattern.

Preferably, in a method for manufacturing a multilayer circuit board according to a preferred embodiment of the present invention, the at least one semi-through hole is a serial semi-through hole including a plurality of semi-through holes, and a serial partially penetrating via-hole conductor is formed from the serial semi-through hole.

Preferably, in a method for manufacturing a multilayer circuit board according to a preferred embodiment of the present invention, the substrate layer is irradiated with a laser beam to form the through hole and the serial semi-through hole.

Preferably, in a method for manufacturing a multilayer circuit board according to a preferred embodiment of the present invention, the substrate layer is supported by a carrier film, and the substrate layer is irradiated with a laser beam from the carrier film side to form the through hole and the serial semi-through hole.

Preferably, in a method for manufacturing a multilayer circuit board according to a preferred embodiment of the present invention, the substrate layer is supported by a carrier film, and the substrate layer is irradiated with a laser beam from the substrate layer side to form the through hole and the serial semi-through hole.

Preferably, a method for manufacturing a multilayer circuit board according to a preferred embodiment of the present invention, further includes a third step of preparing a green laminate that includes the substrate layer and firing the green laminate, wherein the substrate layer in the first step and the second step is a green ceramic sheet.

Accordingly, various preferred embodiments of the present invention provide a multilayer circuit board that is adaptable to high-density wiring in order to address the trend toward a finer pitch between connection terminals of an integrated circuit and that can achieve more reliable interlayer connection between wiring patterns. Other preferred embodiments of the present invention provide a method for manufacturing the multilayer circuit board.

Other features, elements, processes, steps, characteristics and advantages of the present invention will become more apparent from the following detailed description of preferred embodiments of the present invention with reference to the attached drawings.

BRIEF DESCRIPTION OF THE DRAWINGS

FIGS. 3A and 3B a cross-sectional view and a plan view of portion of a wiring pattern of a multilayer circuit board different from the multilayer circuit board illustrated in FIG. 1.

DETAILED DESCRIPTION OF PREFERRED EMBODIMENTS

The present invention will be described below by way of preferred embodiments with reference to FIGS. 1 to 6F.

Figure 1:
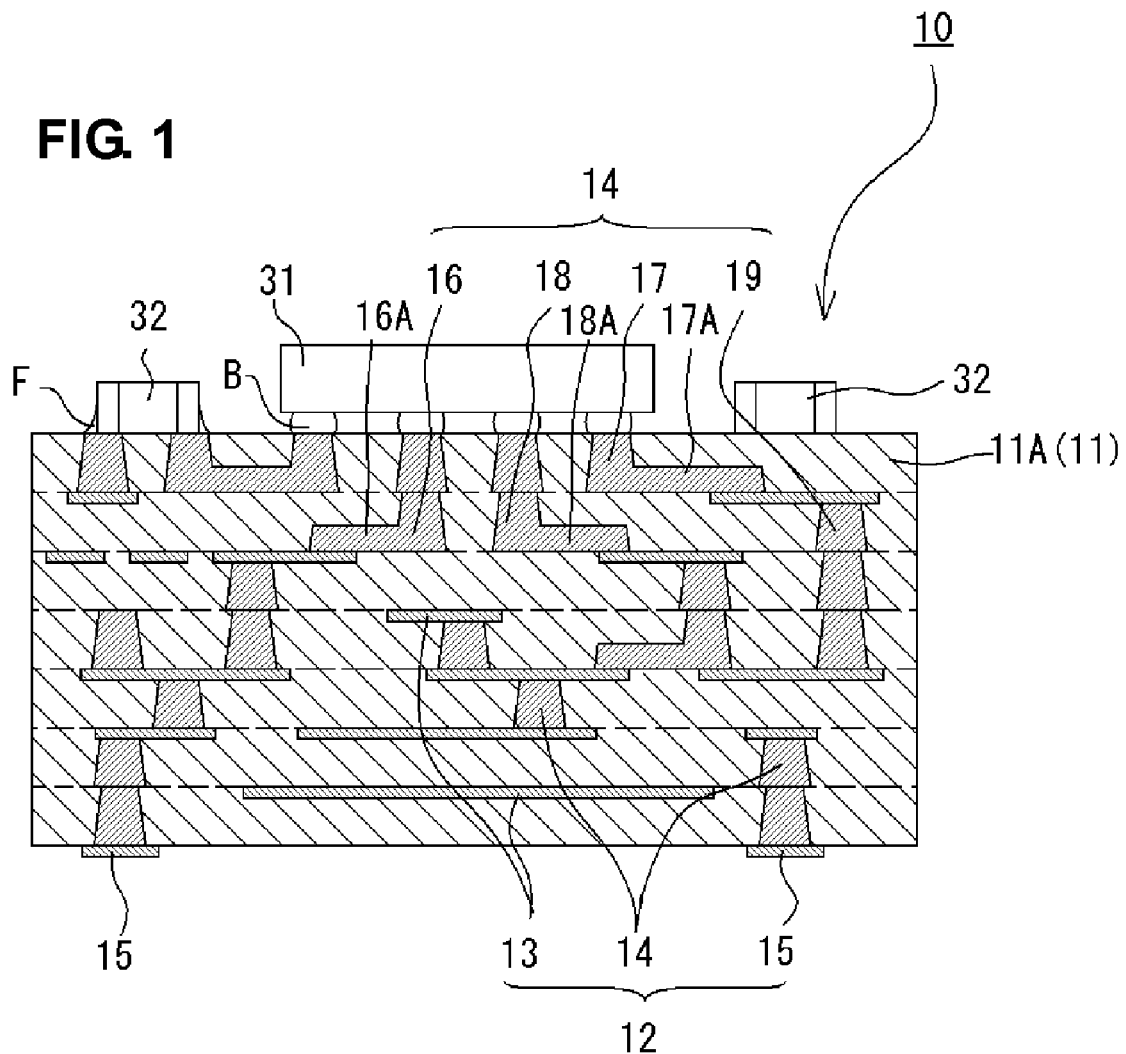
FIG. 1 is a cross-sectional view of a multilayer circuit board according to a preferred embodiment of the present invention.

As illustrated in FIG. 1, a multilayer circuit board 10 according to the present preferred embodiment includes a laminate 11 including a plurality of substrate layers (for example, ceramic layers) 11A, and a wiring pattern 12 disposed in the laminate 11. The multilayer circuit board 10 electrically connects a first surface mount device 31 and a second surface mount device 32 disposed on the top surface of the laminate 11 to a mounting board, such as a motherboard, on which the multilayer circuit board 10 is to be mounted, through the wiring pattern 12. For example, the first surface mount device 31 preferably is an active element, such as a silicon semiconductor element or a gallium arsenide semiconductor element, and the second surface mount device 32 preferably is a passive element, such as a capacitor or an inductor.

Connection terminals of the first surface mount device 31 and the second surface mount device 32 have drastically reduced pitches. Thus, the multilayer circuit board 10 according to the present preferred embodiment includes a surface electrode designed for the finer pitch on the top surface (component side) of the laminate 11. In FIG. 1, the surface electrode includes end surfaces of via-hole conductors constituting the wiring pattern 12. The connection terminals, for example, having a ball grid array structure of the first surface mount device 31 are electrically connected to the end surfaces of the via-hole conductors through solder balls B. An external electrode of the second surface mount device 32 is electrically connected to the end surfaces of the via-hole conductors through solder fillets F. The wiring pattern 12 including the via-hole conductors will be described in detail below. Furthermore, a surface mount device that is not directly connected to the via-hole conductors may be mounted on the laminate 11.

As illustrated in FIG. 1, the wiring pattern 12 includes in-plane conductors (hereinafter referred to as "line conductors") 13, which are disposed between ceramic layers 11A and have predetermined patterns, via-hole conductors 14, which pass through a ceramic layer 11A and are electrically connected to the line conductors 13, and surface electrodes 15 in a predetermined pattern, which are disposed on the undersurface of the laminate 11 and are connected to the via-hole conductors 14 in the bottom ceramic layer 11A. The wiring pattern 12 electrically connects the first surface mount device 31 and the second surface mount device 32 to a mounting board, such as a motherboard, on which the multilayer circuit board 10 is to be mounted. The via-hole conductors 14 in the top ceramic layer 11A can have finer pitches designed for the connection terminals of the first surface mount device 31 and the second surface mount device 32, and ensure the reliability of connection of the first surface mount device 31 and the second surface mount device 32 with the wiring pattern 12.

The via-hole conductors 14 include first, second, and third fully penetrating via-hole conductors 16, 17, and 18 and an independent fully penetrating via-hole conductor (hereinafter referred to simply as "independent via-hole conductor") 19, all of which pass through a predetermined ceramic layer 11A. The via-hole conductors 14 have a structure designed for finer pitches, as compared with via-hole conductors having a known structure. The first, second, and third fully penetrating via-hole conductors 16, 17, and 18 are electrically connected to partially penetrating via-hole conductors 16A, 17A, and 18A in the respective same ceramic layers 11A. The partially penetrating via-hole conductors 16A, 17A, and 18A do not pass completely through the ceramic layers 11A. The partially penetrating via-hole conductors 16A, 17A, and 18A are bored into a surface (undersurface in FIG. 1) of the ceramic layers 11A partway toward the top surface. The openings of the partially penetrating via-hole conductors 16A, 17A, and 18A are flush with the undersurface of the ceramic layers 11A. The independent via-hole conductor 19 is not connected to a partially penetrating via-hole conductor. Thus, a multilayer circuit board 10 according to the present preferred embodiment includes a fully penetrating via-hole conductor in contact with a partially penetrating via-hole conductor in a ceramic layer 11A.

The number of partially penetrating via-hole conductors depends on the distance between the first, second, and third fully penetrating via-hole conductors 16, 17, and 18 and line conductors 13 to be connected to the first, second, and third fully penetrating via-hole conductors 16, 17, and 18. In general, a serial partially penetrating via-hole conductor including a plurality of partially penetrating via-hole conductors is formed in a manner that depends on the distance between the first, second, and third fully penetrating via-hole conductors 16, 17, and 18 and the respective line conductors 13. Serial partially penetrating via-hole conductors connected to the first, second, and third fully penetrating via-hole conductors 16, 17, and 18 in the respective same ceramic layers 11A are referred to as a first, second, and third serial partially penetrating via-hole conductors 16A, 17A, and 18A, respectively. Preferably, the first, second, and third serial partially penetrating via-hole conductors 16A, 17A, and 18A preferably have a length in the range of about 30 µm to about 500 µm, for example. A serial partially penetrating via-hole conductor having a length less than about 30 µm cannot improve the reliability of connection. On the other hand, a serial partially penetrating via-hole conductor having a length more than about 500 µm is difficult to combine with a fully penetrating via-hole conductor.

A fully penetrating via-hole conductor and a serial partially penetrating via-hole conductor can be combined in a single process, as described below. The serial partially penetrating via-hole conductor can therefore function as part of a line conductor or as a line conductor. Thus, as compared with existing processes in which a via-hole conductor and a line conductor are formed in different steps, the single process eliminates the allowance for misalignment between the via-hole conductor and the line conductor, thus achieving a finer pitch. In addition, the single process can improve the reliability of connection between the fully penetrating via-hole conductor and the serial partially penetrating via-hole conductor. A multilayer circuit board in which a fully penetrating via-hole conductor and a serial partially penetrating via-hole conductor are disposed in upper and lower ceramic layers is disclosed in commonly assigned Japanese patent application No. 2004-111976.

Figure 2A:
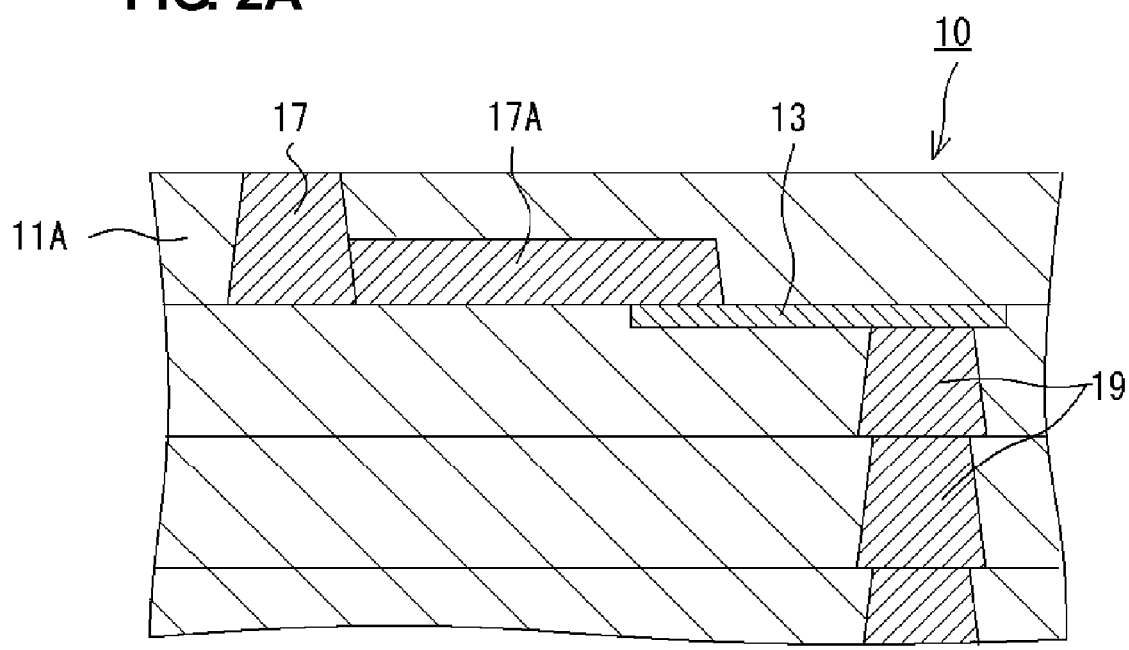
FIGS. 2A and 2B an enlarged cross-sectional view and an enlarged plan view of part of the multilayer circuit board illustrated in FIG. 1.
Figure 2B:
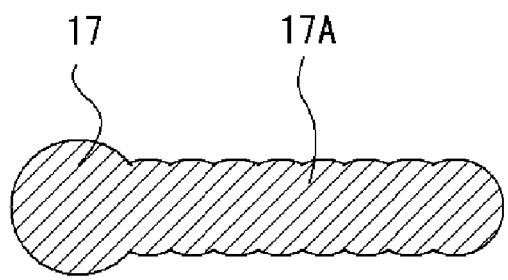

FIGS. 2A and 2B are enlarged views of the second fully penetrating via-hole conductor 17 and the second serial partially penetrating via-hole conductor 17A illustrated in FIG. 1. As illustrated in FIG. 2A, the second fully penetrating via-hole conductor 17 has a generally truncated cone shape. As illustrated in FIG. 2B, the second serial partially penetrating via-hole conductor 17A includes truncated conical partially penetrating via-hole conductors that have a cross-sectional area smaller than that of the second fully penetrating via-hole conductor 17 and overlap each other in the horizontal direction. In the present preferred embodiment, via-hole conductor holes are formed by a laser beam. A serial partially penetrating via-hole conductor thus formed has recessed and raised portions on both sides thereof. The wide undersurface of the truncated conical fully penetrating via-hole conductor functions as a connection land. The shape of the via-hole conductor is not limited to a truncated cone and may be a cylinder or other suitable shape.

While the first, second, and third fully penetrating via-hole conductors 16, 17, and 18 preferably have the same shape, as illustrated in FIG. 1, the first, second, and third serial partially penetrating via-hole conductors 16A, 17A, and 18A connected to the first, second, and third fully penetrating via-hole conductors 16, 17, and 18, respectively, may extend in different directions. Preferably, the first, second, and third serial partially penetrating via-hole conductors 16A, 17A, and 18A also extend away from fully penetrating via-hole conductors (including the independent via-hole conductor 19) other than the first, second, and third fully penetrating via-hole conductors 16, 17, and 18. This reduces the distance between the first, second, and third fully penetrating via-hole conductors 16, 17, and 18 and the distance between the first, second, and third fully penetrating via-hole conductors 16, 17, and 18 and the independent via-hole conductor 19. In particular, the fully penetrating via-hole conductors and the partially penetrating via-hole conductors disposed in the top ceramic layer 11A of the laminate 11 can be designed for a finer pitch of the first surface mount device 31 and the second surface mount device 32.

The reason that different extending directions of the first, second, and third serial partially penetrating via-hole conductors 16A, 17A, and 18A connected to the first, second, and third fully penetrating via-hole conductors 16, 17, and 18, respectively, result in a reduction in the distance between the first, second, and third fully penetrating via-hole conductors 16, 17, and 18 and the distance between the first, second, and third fully penetrating via-hole conductors 16, 17, and 18 and the independent via-hole conductor 19 will be described below with reference to FIGS. 3A, 3B, 4A and 4B. While a wiring structure in FIGS. 3A, 3B, 4A and 4B is different from that of the multilayer circuit board 10 illustrated in FIG. 1, like components are denoted by like numerals. FIG. 3A is a cross-sectional view taken along the line A-A in FIG. 3B.

As illustrated in FIG. 3A, the first and second fully penetrating via-hole conductors 16 and 17 are symmetrical about the independent via-hole conductor 19. The first and second fully penetrating via-hole conductors 16 and 17 are in contact with the first and second serial partially penetrating via-hole conductors 16A and 17A extending away from an adjacent independent via-hole conductor 19. The first and second fully penetrating via-hole conductors 16 and 17 are connected to line conductors 13 through the first and second serial partially penetrating via-hole conductors 16A and 17A. Thus, the first and second fully penetrating via-hole conductors 16 and 17 have no protrusion extending toward the adjacent independent via-hole conductor 19, and therefore can be placed closer to the adjacent independent via-hole conductor 19.

Furthermore, as illustrated in FIG. 3B, a first row of via-hole conductors and a third row of via-hole conductors are symmetrical about a second row of via-hole conductors. Third, fourth, and fifth fully penetrating via-hole conductors 18, 20, and 21 in the first and third rows are in contact with third, fourth, and fifth serial partially penetrating via-hole conductors 18A, 20A, and 21A, which extend in the same ceramic layer 11A. The first and second fully penetrating via-hole conductors 16 and 17 and the third, fourth, and fifth fully penetrating via-hole conductors 18, 20, and 21 are symmetrical about the independent via-hole conductor 19. The third, fourth, and fifth serial partially penetrating via-hole conductors 18A, 20A, and 21A extend away from the adjacent fully penetrating via-hole conductors, and are connected to the line conductors 13 through respective connection lands 13A. The relationship between the first and second fully penetrating via-hole conductors 16 and 17 and the independent via-hole conductor 19 also applies to the third, fourth, and fifth fully penetrating via-hole conductors 18, 20, and 21.

In the present preferred embodiment, while the connection lands 13A are disposed on the line conductors 13, the connection lands 13A may be disposed on the serial partially penetrating via-hole conductors. The connection lands 13A may be disposed on the serial partially penetrating via-hole conductors by making the outer diameter of the partially penetrating via-hole conductors that are farthest from the fully penetrating via-hole conductors larger than the outer diameter of the fully penetrating via-hole conductors.

As illustrated in FIG. 3B, the first and second serial partially penetrating via-hole conductors 16A and 17A and the third, fourth, and fifth serial partially penetrating via-hole conductors 18A, 20A, and 21A extend radially around the independent via-hole conductor 19 from the first and second fully penetrating via-hole conductors 16 and 17 and third, fourth, and fifth fully penetrating via-hole conductors 18, 20, and 21. As illustrated in FIG. 3A, the first and second fully penetrating via-hole conductors 16 and 17 and the first and second serial partially penetrating via-hole conductors 16A and 17A are disposed in the same ceramic layer 11A. However, when the first and second serial partially penetrating via-hole conductors 16A and 17A interfere with each other, the second fully penetrating via-hole conductor 17 may be formed in a ceramic layer 11A deeper than that of the first fully penetrating via-hole conductor 16 by placing an independent via-hole conductor 19 on the second fully penetrating via-hole conductor 17.

Figure 4A:
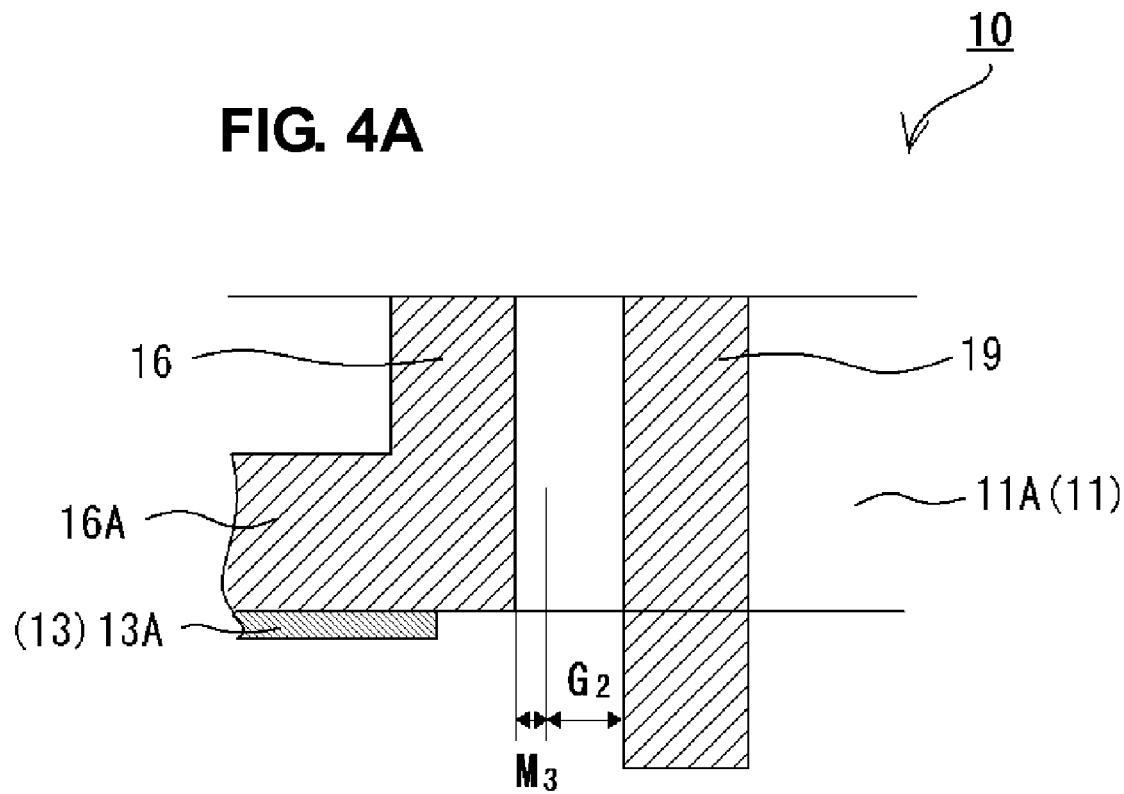
FIGS. 4A and 4B are schematic views illustrating a finer pitch of the multilayer circuit board illustrated in FIGS. 3A and 3B, as compared with a known wiring pattern.
Figure 4B:
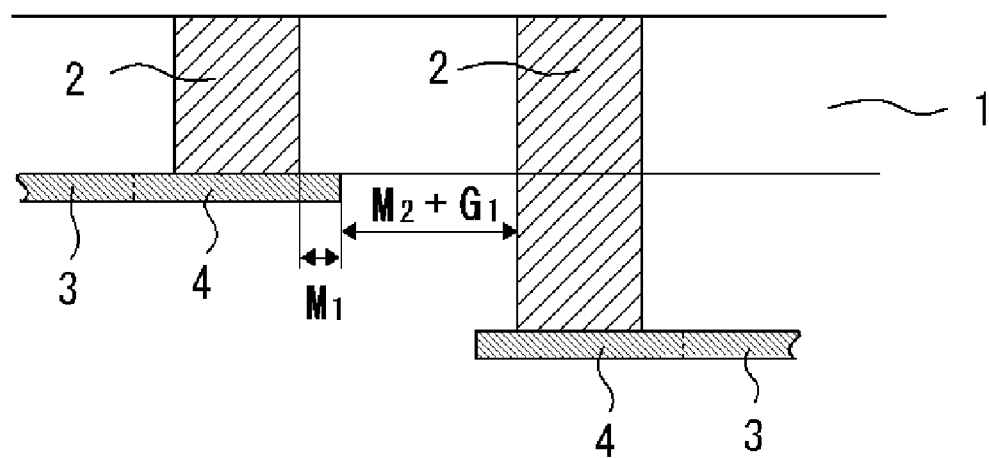

The extent to which the fully penetrating via-hole conductor and the partially penetrating via-hole conductor according to the present preferred embodiment can achieve finer pitch relative to known via-hole conductors will be described below with reference to FIGS. 4A and 4B, taking the relationship between the first fully penetrating via-hole conductor 16 and the independent via-hole conductor 19 by way of example. In general, as illustrated in FIG. 4B, the distance between adjacent fully penetrating via-hole conductors 2 and 2 is $(M_1+M_2+G_1)$. $M_1$ denotes the protrusion size of a connection land 4 from a fully penetrating via-hole conductor 2 to ensure the connection between the fully penetrating via-hole conductors 2 and a line conductor 3. $G_1$ denotes the minimum distance to prevent short or delamination between the connection land 4 and the adjacent fully penetrating via-hole conductor 2. $M_2$ denotes the allowance for misalignment. The distance $(M_1+M_2+G_1)$ is generally about 200 μm, for example. Hence, the distance between the fully penetrating via-hole conductors 2 in known wiring structures is difficult to reduce below about 200 μm.

In contrast, in the present preferred embodiment, the distance between a first fully penetrating via-hole conductor 16 and an adjacent independent via-hole conductor 19 is $(M_3+G_2)$. $G_2$ denotes the minimum distance to prevent a short or delamination between the first fully penetrating via-hole conductor 16 and the adjacent independent via-hole conductor 19. $M_3$ denotes the allowance for misalignment between the first fully penetrating via-hole conductor 16 and the independent via-hole conductor 19. $G_2$ in the wiring structure according to the present preferred embodiment preferably is substantially the same as $G_1$ in the known wiring structures. As for $M_3$, because the first fully penetrating via-hole conductor 16 to be connected to a line conductor 13 and the independent via-hole conductor 19 are formed in a single process, a processing error only depends on the processing accuracy of via-holes. The single process eliminates a factor of pattern extension during printing of a line conductor and a processing error caused by two steps of processing via-holes and printing line conductors, thus reducing the misalignment.

Thus, as a first advantage of the present preferred embodiment, the protrusion $M_1$ of the connection land 13A having a diameter larger than the outer diameter of the via-hole conductor for the purpose of reliable connection can be eliminated. As a second advantage, the allowance for misalignment $M_2$ to prevent the occurrence of a short or a crack (delamination) between the adjacent first fully penetrating via-hole conductor 16 and the independent via-hole conductor 19 can be reduced. Consequently, the present preferred embodiment greatly reduces the distance between the first fully penetrating via-hole conductor 16 and the independent via-hole conductor 19 to about 100 µm, which is half of the conventional distance.

While the substrate layer preferably is a ceramic layer in the present preferred embodiment, the substrate layer is not limited to a ceramic layer. The substrate layer may be a thermosetting resin layer. When the substrate layer is a ceramic layer, the substrate layer may be a low-temperature co-fired ceramic (LTCC) layer. The low-temperature co-fired ceramic material can be sintered at a temperature of about 1050° C. or less and can be co-fired with silver or copper, which has a low specific resistance. Examples of the low-temperature co-fired ceramic material include glass composite LTCC materials composed of a ceramic powder, such as alumina, zirconia, magnesia, or forsterite, and borosilicate glass; crystallized glass LTCC materials containing $ZnO$—$MgO$—$Al_2O_3$—$SiO_2$ crystallized glass; and non-glass LTCC materials containing a $BaO$—$Al_2O_3$—$SiO_2$ ceramic powder or a $Al_2O_3$—$CaO$—$SiO_2$—$MgO$—$B_2O_3$ ceramic powder. When a low-temperature co-fired ceramic material is used as a material for the ceramic layers 11A, a metal that has a low resistance and a low melting point, such as silver or copper, can be used as a material for the wiring pattern 12. Thus, the laminate 11 and the wiring pattern 12 can be co-fired at a low temperature of about 1050° C. or less.

Furthermore, the substrate layer may be a high-temperature co-fired ceramic (HTCC) layer. A high-temperature co-fired ceramic material may be prepared by sintering alumina, aluminum nitride, mullite, and another material and a sintering aid, such as glass, at a temperature of at least about 1100° C. In this case, the wiring pattern 12 is formed of a metal selected from the group consisting of molybdenum, platinum, palladium, tungsten, nickel, and alloys thereof.

A method for manufacturing a multilayer circuit board according to a preferred embodiment of the present invention will be described below with reference to FIGS. 5A-5F and 6A-6E.

Figure 5A:
FIGS. 5A to 5F are process drawings of a principal portion in a method for manufacturing a multilayer circuit board according to a preferred embodiment of the present invention in order of process.
Figure 6A:
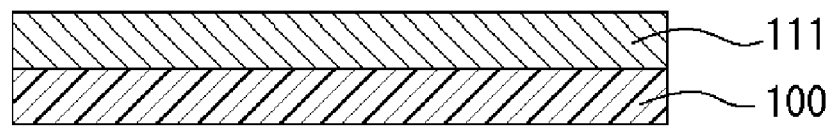
FIGS. 6A-6F are process drawings of a principal portion in a method for manufacturing a multilayer circuit board according to another preferred embodiment of the present invention in order of process.
Figure 6B:
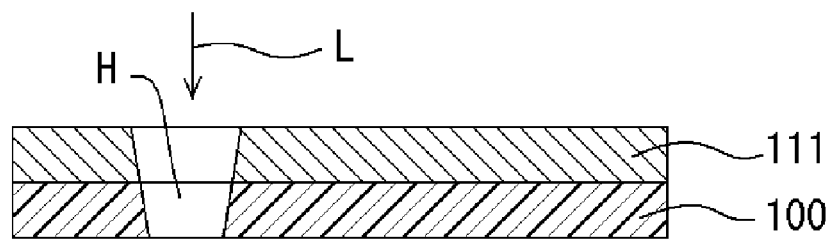
Figure 6C:
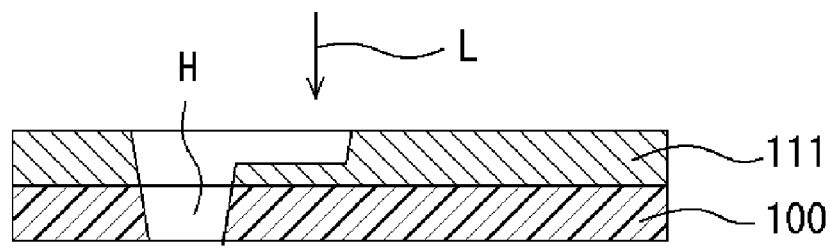
Figure 6D:
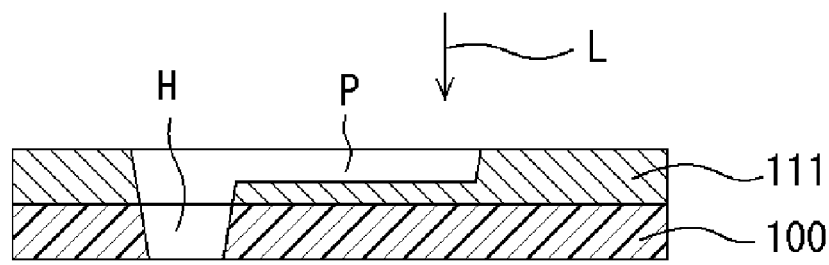
Figure 6E:
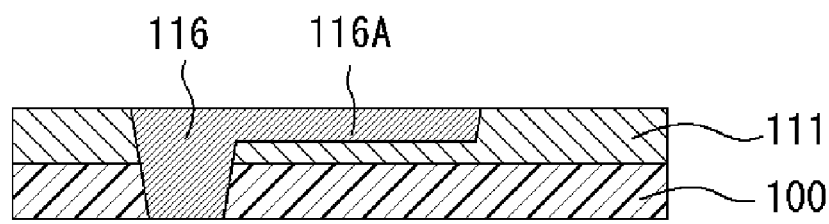
Figure 6F:
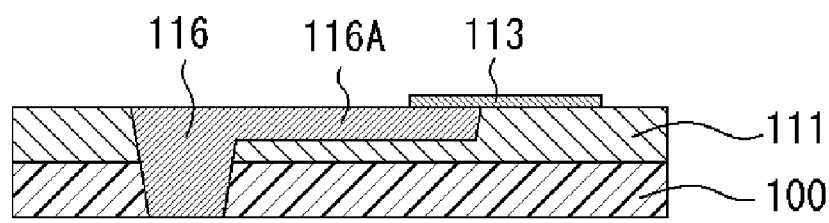
Figure 7A:
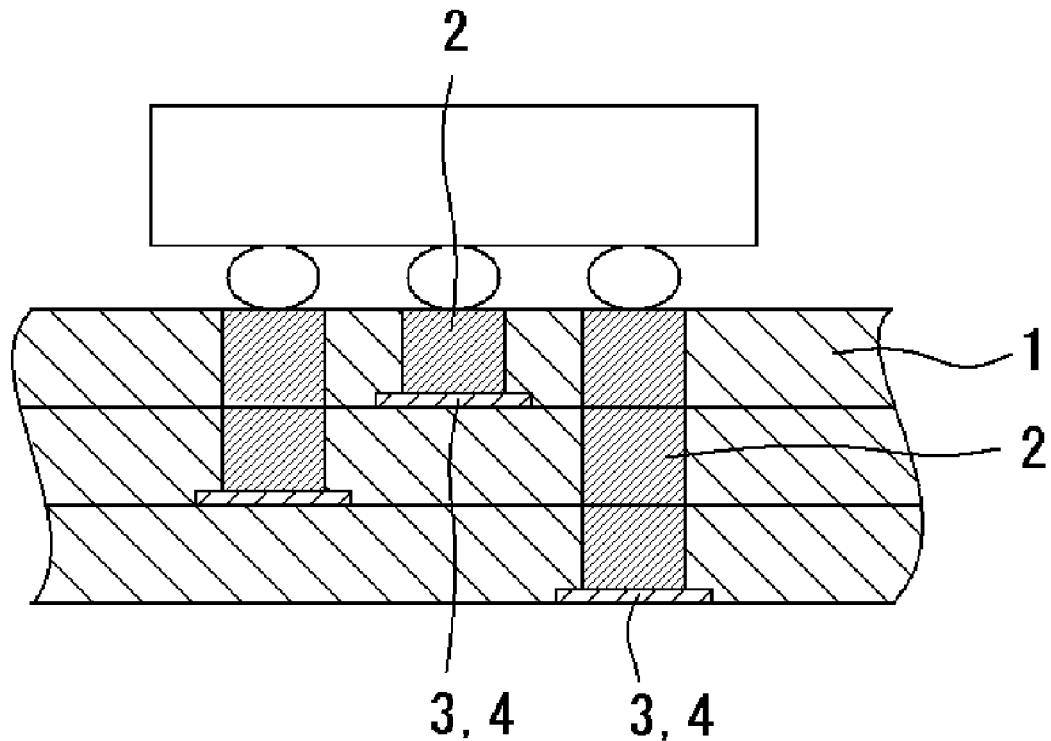
FIG. 7A is a cross-sectional view of a principal part of a known multilayer circuit board.
Figure 7B:
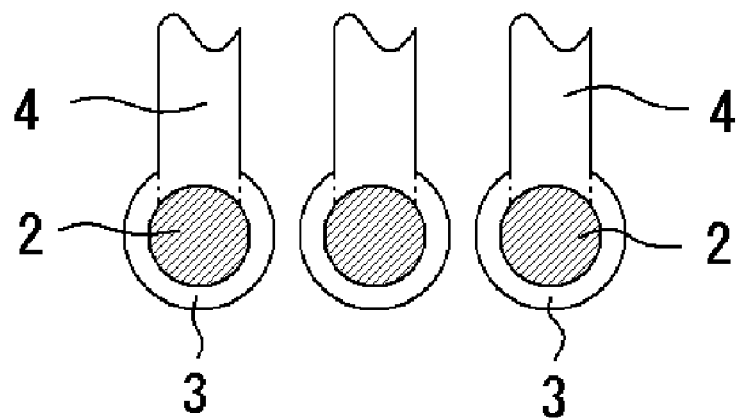
FIG. 7B is a plan view of a connection structure between via-hole conductors and line conductors in a known multilayer circuit board, viewed from a via-hole conductor side.
Figure 8:
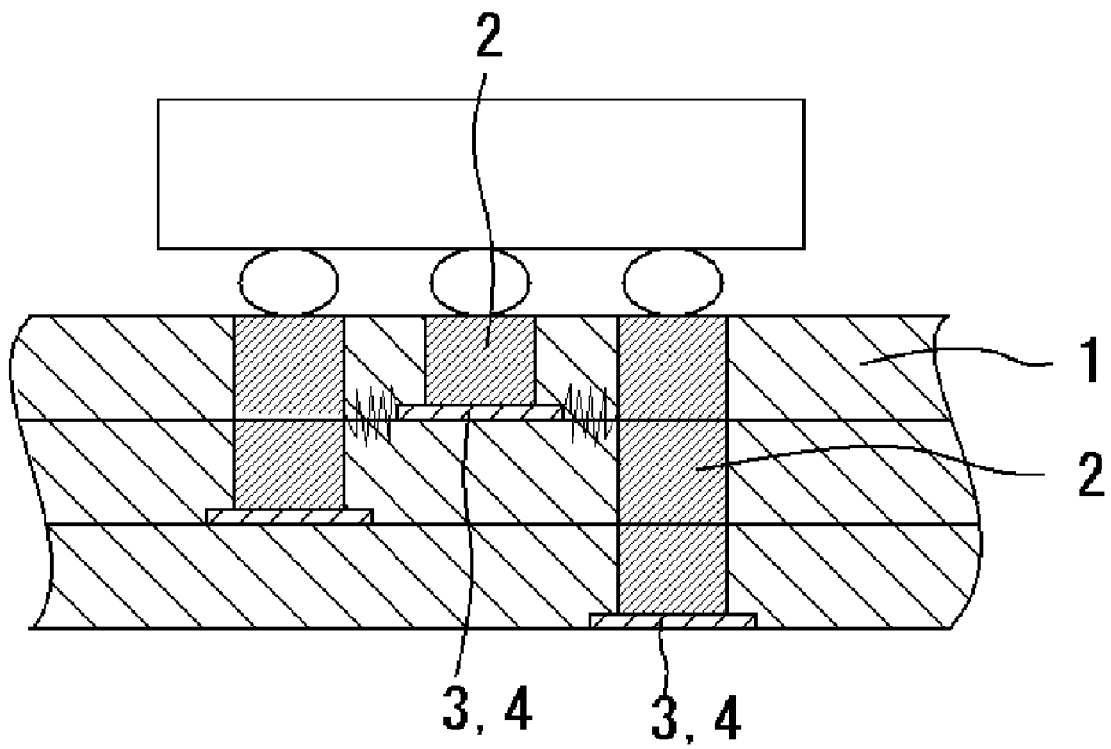
FIG. 8 is a schematic view illustrating short between via-hole conductors and a line conductor in the multilayer circuit board illustrated in FIGS. 7A and 7B.

First, a low-temperature co-fired ceramic material (for example, a ceramic material containing $Al_2O_3$ as filler and borosilicate glass as a sintering aid) is dispersed in a binder, such as vinyl alcohol, to prepare a slurry. As illustrated in FIGS. 5A and 6A, the slurry is applied to a carrier film 100, for example, by a doctor blade method to form a ceramic green sheet 111 for low-temperature sintering. The ceramic green sheet is subsequently cut into a predetermined size.

Then, in order to form the first, second, and third fully penetrating via-hole conductors 16, 17, and 18 and the independent via-hole conductor 19, the ceramic green sheet 111 is irradiated with a laser beam, such as a $CO_2$ laser beam, to form via-hole conductor holes having a predetermined shape in a predetermined pattern. The via-hole conductor holes are filled with a conductive paste to form independent via-hole conductor portions for an independent via-hole conductor 19, which vertically passes through the ceramic green sheet 111. The formation of a first fully penetrating via-hole conductor 16 and a first serial partially penetrating via-hole conductor 16A will be described below with reference to FIGS. 5A-5F and 6A-6E.

A via-hole conductor hole is formed in the ceramic green sheet 111 by a method in which the ceramic green sheet 111 is irradiated with a laser beam from the carrier film 100 side or a method in which the ceramic green sheet 111 is irradiated with a laser beam from the green sheet 111 side.

First, a method in which the ceramic green sheet 111 is irradiated with a laser beam from the carrier film 100 side will be described with reference to FIGS. 5A-5F. As illustrated in FIG. 5A, the carrier film 100 is arranged so as to face a source of a laser beam L.

Figure 5B:
Figure 5C:
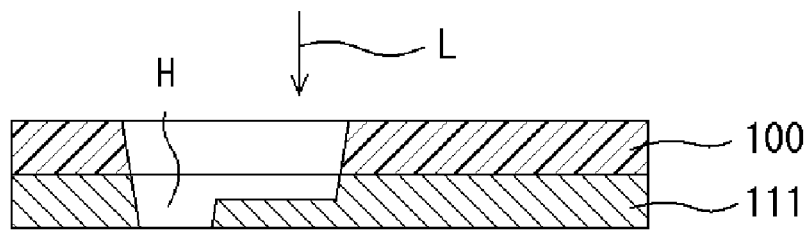
Figure 5D:
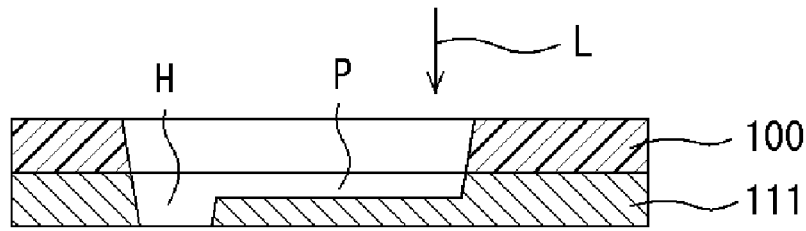

Second, as illustrated in FIG. 5B, the ceramic green sheet 111 is irradiated with the laser beam L from the carrier film 100 side to form a via-hole conductor hole H preferably having a shape of a generally inverted frustum of a cone. Subsequently, the radiation energy of the laser beam L is reduced such that the laser beam L does not pass completely through the ceramic green sheet 111. The laser beam L is then moved to the right from the position illustrated in FIG. 5B. The travel distance of the laser beam L is predetermined to be such that the laser beam L overlaps the via-hole conductor hole H. The laser beam L passes through the carrier film 100 every travel distance and forms an inverted frustum of a cone in the ceramic green sheet 111. As illustrated in FIG. 5C, a semi-through hole of an inverted frustum of a cone is continuously formed in the ceramic green sheet 111 with the movement of the laser beam L. Finally, as illustrated in FIG. 5D, a groove P is formed in contact with the via-hole conductor hole H.

Preferably, in terms of the processability of the via-hole conductor hole H and the groove P, the ceramic green sheet 111 has a thickness in the range of about 10 µm to about 250 µm, and the carrier film has a thickness in the range of about 25 µm to about 100 µm, for example. Thicknesses larger than these values result in poor processability of the via-hole conductor hole H, and thicknesses smaller than these values result in poor processability of the groove P. Preferably, the groove P preferably has a length in the range of about 30 µm to about 500 µm, for example. The groove P having a length less than about 30 µm cannot improve the reliability of connection. For the groove P having a length more than about 500 µm, it is difficult to fill the via-hole conductor hole H and the groove P with a conductive paste. The average depth of the groove P is preferably in the range of about 15% to about 95% and more preferably in the range of about 25% to about 60% of the thickness of the ceramic green sheet 111. When the depth is less than about 15%, the reliability of connection cannot be improved. When the depth is more than about 95%, the groove P may path through the ceramic green sheet 111 if a variation in processing occurs.

Figure 5E:
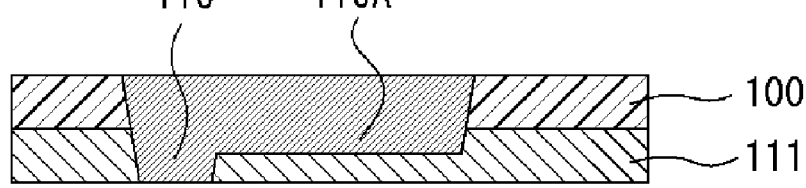
Figure 5F:
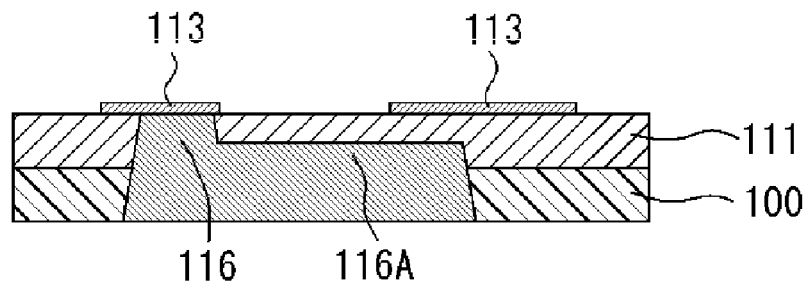

A conductive paste mainly composed of Ag or Cu is then charged into the via-hole conductor hole H and the groove P in the ceramic green sheet 111 from the carrier film 100 side. Excessive conductive paste is removed from the carrier film 100. As illustrated in FIG. 5E, a first fully penetrating via-hole conductor portion 116 and a first serial partially penetrating via-hole conductor portion 116A are formed. As illustrated in FIG. 5F, after the ceramic green sheet 111 is turned upward, the conductive paste is applied to the ceramic green sheet 111 in a predetermined pattern, for example, by screen printing to form a line conductor portion 113.

In a method in which the ceramic green sheet 111 is irradiated with a laser beam from the green sheet 111 side, as illustrated in FIG. 6A, the ceramic green sheet 111 is arranged so as to face a source of a laser beam L. In the same manner as described above, as illustrated in FIGS. 6B to 6F, the laser beam L is irradiated from the ceramic green sheet 111 side; a via-hole conductor hole H and a groove P are formed in the ceramic green sheet 111; the via-hole conductor hole H and the groove P are filled with a conductive paste to form a first fully penetrating via-hole conductor portion 116 and a first serial partially penetrating via-hole conductor portion 116A; and the conductive paste is applied to the ceramic green sheet 111 in a predetermined pattern, for example, by screen printing to form a line conductor portion 113.

Following the procedures as described above, first, second, and third fully penetrating via-hole conductor portions, first, second, and third serial partially penetrating via-hole conductor portions, independent via-hole conductor portions, and line conductor portions are appropriately formed in or on a plurality of ceramic green sheets. These ceramic green sheets are laminated and pressed at a predetermined pressure to form a green laminate.

Break grooves for separating multilayer circuit boards are then formed in the surface of the green laminate. The green laminate is then fired at a predetermined temperature of about 1050° C. or less to form a sintered compact. The sintered compact is plated and is separated into a plurality of multilayer circuit boards 10 according to the present preferred embodiment.

As described above, a multilayer circuit board according to the present preferred embodiment includes a laminate 11 of a plurality of ceramic layers 11A; and a wiring pattern 12 disposed in the laminate 11, wherein at least one layer of the plurality of ceramic layers 11A includes, as the wiring pattern 12, the first, second, and third fully penetrating via-hole conductors 16, 17, and 18 that vertically pass through the ceramic layers 11A, and a first, second, and third serial partially penetrating via-hole conductors 16A, 17A, and 18A that are electrically connected to the fully penetrating via-hole conductors 16, 17, and 18 in the ceramic layers 11A and do not pass completely through the ceramic layers 11A. Hence, as compared with existing processes in which via-hole conductors and line conductors are formed in different steps, the present preferred embodiment eliminates the allowance for misalignment between the via-hole conductor and the line conductor, thus achieving a finer pitch. In addition, the present preferred embodiment can improve the reliability of connection between the first, second, and third fully penetrating via-hole conductors 16, 17, and 18 and the first, second, and third serial partially penetrating via-hole conductors 16A, 17A, and 18A in the ceramic layers 11A.

In particular, a ceramic layer 11A that includes the second fully penetrating via-hole conductor 17 and the second serial partially penetrating via-hole conductor 17A is disposed at the top of the laminate 11 such that the second serial partially penetrating via-hole conductor 17A is disposed on the bottom, and that an end surface of the second fully penetrating via-hole conductor 17 on a top surface of the ceramic layer 11A is arranged to be connected to connection terminals of the first surface mount device 31 and the second surface mount device 32 to be mounted on the ceramic layer 11A. Thus, the structure can be designed for a finer pitch of the first surface mount device 31 and the second surface mount device 32, and achieve a reduction in profile of the laminate 11 and therefore the multilayer circuit board 10.

Furthermore, the first, second, and third fully penetrating via-hole conductors 16, 17, and 18 are connected to the line conductors 13 through the first, second, and third serial partially penetrating via-hole conductors 16A, 17A, and 18A in the laminate 11. Thus, the connection lands 13A of the line conductors 13 have no protrusion extending toward the via-hole conductors 14. This prevents short between the connection lands 13A and the via-hole conductors 14 even when the wiring pattern 12 has a greater packaging density. Furthermore, the via-hole conductors 14 include the first, second, and third fully penetrating via-hole conductors 16, 17, and 18, which are adjacent to each other. The first, second, and third serial partially penetrating via-hole conductors 16A, 17A, and 18A connected to the first, second, and third fully penetrating via-hole conductors 16, 17, and 18 extend away from the other fully penetrating via-hole conductors. The first, second, and third fully penetrating via-hole conductors 16, 17, and 18 have no protrusion extending toward the other fully penetrating via-hole conductors. Thus, the distance between the first, second, and third fully penetrating via-hole conductors 16, 17, and 18 can be reduced. Thus, the wiring pattern 12 can have a greater packaging density. Furthermore, the ceramic layers 11A are formed of a low-temperature co-fired ceramic material, and the wiring pattern 12 is formed of an electroconductive material mainly composed of Ag or Cu, for example. Hence, the ceramic layers 11A and the wiring pattern 12 can be fired at a low temperature of about 1050° C. or less.

Furthermore, a method for manufacturing a multilayer circuit board 10 according to the present preferred embodiment includes the steps of forming a via-hole conductor hole H and a groove P in a plurality of ceramic green sheets 111, which are to be converted into a plurality of ceramic layers 11A, the via-hole conductor hole H vertically passing through a plurality of ceramic green sheets 111, the groove P being in contact with the via-hole conductor hole H and not passing through the ceramic green sheet 111; and filling the via-hole conductor hole H and the groove P with a conductive paste to form as a wiring pattern 12 a first fully penetrating via-hole conductor portion 116 and a first partially penetrating via-hole conductor portion 116A. The first fully penetrating via-hole conductor 16 and the first partially penetrating via-hole conductor 16A can be combined in a ceramic layer 11A in a single process. This can improve the reliability of connection between the first fully penetrating via-hole conductor 16 and the first partially penetrating via-hole conductor 16A.

Furthermore, the ceramic green sheet 111, which is to be converted into the ceramic layers 11A, is irradiated with a laser beam to form the via-hole conductor hole H and the groove P. Thus, the first, second, and third fully penetrating via-hole conductors 16, 17, and 18 and the first, second, and third serial partially penetrating via-hole conductors 16A, 17A, and 18A can properly be formed even with a greater packaging density. The ceramic green sheet 111 is supported by the carrier film 100. The ceramic green sheet 111 is irradiated with a laser beam from the carrier film 100 side or the ceramic green sheet 111 side to form the via-hole conductor hole H and the groove P. Thus, the via-hole conductor hole H and the groove P can properly be formed.

The present invention is not limited to the preferred embodiments described above. For example, while the upper end surfaces of the fully penetrating via-hole conductors in a top ceramic layer 11A preferably define the surface electrode for the first surface mount device 31 and the second surface mount device 32 in the preferred embodiments described above, a surface electrode serving as a connection land may be formed on the upper end surfaces of the fully penetrating via-hole conductors, if the space allows. Furthermore, while the fully penetrating via-hole conductors in the top layer are preferably used as the connection terminals for the first and second surface mount devices in the embodiments described above, the lower end surfaces of fully penetrating via-hole conductors in the bottom ceramic layer 11A may be used as the connection terminals for a mounting board, such as a motherboard.

Preferred embodiments of the present invention can suitably be utilized for a multilayer circuit board on which various surface mount devices are to be mounted.

While preferred embodiments of the present invention have been described above, it is to be understood that variations and modifications will be apparent to those skilled in the art without departing the scope and spirit of the present inven-

What is claimed is:

1. A multilayer circuit board comprising:
a laminate including a plurality of substrate layers; and
a wiring pattern disposed in the laminate; wherein
at least one layer of the plurality of substrate layers includes, as the wiring pattern, at least one fully penetrating via-hole conductor that vertically passes through the substrate layer, and at least one partially penetrating via-hole conductor that is electrically connected to the fully penetrating via-hole conductor in the substrate layer and does not pass completely through the substrate layer;
each of the at least one fully penetrating via-hole conductor and the at least one partially penetrating via-hole conductor is made of metal; and
the at least one fully penetrating via-hole conductor and the at least one partially penetrating via-hole conductor extend continuously along the at least one layer of the plurality of substrate layers such that no portion of the at least one layer of the plurality of substrate layers is disposed between the at least one fully penetrating via-hole conductor and the at least one partially penetrating via-hole conductor.

2. The multilayer circuit board according to claim 1, wherein the at least one partially penetrating via-hole conductor is at least one serial partially penetrating via-hole conductor including a plurality of partially penetrating via-hole conductors.

3. The multilayer circuit board according to claim 2, wherein the substrate layer that includes the at least one fully penetrating via-hole conductor and the at least one serial partially penetrating via-hole conductor is disposed at the top of the laminate.

4. The multilayer circuit board according to claim 3, wherein the substrate layer that includes the at least one fully penetrating via-hole conductor and the at least one serial partially penetrating via-hole conductor is arranged such that the serial partially penetrating via-hole conductor is disposed on the bottom, and an end surface of the fully penetrating via-hole conductor on a top surface of the substrate layer is arranged to be connected to a connection terminal of a surface mount device to be mounted on the substrate layer.

5. The multilayer circuit board according to claim 2, wherein the at least one fully penetrating via-hole conductor is connected to at least one in-plane conductor of the substrate layer through the at least one serial partially penetrating via-hole conductor.

6. The multilayer circuit board according to claim 2, wherein the at least one fully penetrating via-hole conductor includes a first fully penetrating via-hole conductor and a second fully penetrating via-hole conductor, the first fully penetrating via-hole conductor and the second fully penetrating via-hole conductor being adjacent to each other, and a first serial partially penetrating via-hole conductor connected to the first fully penetrating via-hole conductor extends away from the second fully penetrating via-hole conductor.

7. The multilayer circuit board according to claim 6, wherein a second serial partially penetrating via-hole conductor connected to the second fully penetrating via-hole conductor extends away from the first fully penetrating via-hole conductor.

8. The multilayer circuit board according to claim 6, wherein the at least one fully penetrating via-hole conductor further includes a third fully penetrating via-hole conductor, which is adjacent to the first fully penetrating via-hole conductor or the second fully penetrating via-hole conductor, wherein a third serial partially penetrating via-hole conductor connected to the third fully penetrating via-hole conductor extends away from the first fully penetrating via-hole conductor and the second fully penetrating via-hole conductor.

9. The multilayer circuit board according to claim 1, wherein the substrate layer is composed of a low-temperature co-fired ceramic material, and the wiring pattern is composed of an electroconductive material mainly composed of silver or copper.

10. A method for manufacturing a multilayer circuit board that includes a laminate of a plurality of substrate layers and a wiring pattern disposed in the laminate, the method comprising:
a first step of forming a through hole that vertically passes through at least one layer of the plurality of substrate layers, and at least one semi-through hole that is in contact with the through hole and does not pass completely through the substrate layer; and
a second step of filling the through hole and the at least one semi-through hole with a metal to form a fully penetrating via-hole conductor and a partially penetrating via-hole conductor as the wiring pattern; wherein
the fully penetrating via-hole conductor and the partially penetrating via-hole conductor extend continuously along the at least one layer of the plurality of substrate layers such that no portion of the at least one layer of the plurality of substrate layers is disposed between the at least one fully penetrating via-hole conductor and the at least one partially penetrating via-hole conductor.

11. The method for manufacturing a multilayer circuit board according to claim 10, wherein the at least one semi-through hole is a serial semi-through hole formed of a plurality of semi-through holes, and a serial partially penetrating via-hole conductor is formed from the serial semi-through hole.

12. The method for manufacturing a multilayer circuit board according to claim 11, further comprising the step of irradiating the substrate layer with a laser beam to form the through hole and the serial semi-through hole.

13. The method for manufacturing a multilayer circuit board according to claim 12, further comprising the steps of supporting the substrate layer with a carrier film, and irradiating the substrate layer with a laser beam from the carrier film side to form the through hole and the serial semi-through hole.

14. The method for manufacturing a multilayer circuit board according to claim 12, further comprising the steps of supporting the substrate layer with a carrier film, and irradiating the substrate layer with a laser beam from the substrate layer side to form the through hole and the serial semi-through hole.

15. The method for manufacturing a multilayer circuit board according to claim 10, further comprising a third step of preparing a green laminate that includes the substrate layer and firing the green laminate, wherein the substrate layer in the first step and the second step is a green ceramic sheet.

* * * * *